United States Patent
Jindo et al.

(10) Patent No.: US 7,975,899 B2
(45) Date of Patent: Jul. 12, 2011

(54) WORK CLAMP AND WIRE BONDING APPARATUS

(75) Inventors: Riki Jindo, Hamura (JP); Hideki Yoshino, Hamura (JP); Mami Kushima, Hamura (JP)

(73) Assignee: Kaijo Corporation, Tokyo (JP)

( * ) Notice: Subject to any disclaimer, the term of this patent is extended or adjusted under 35 U.S.C. 154(b) by 0 days.

(21) Appl. No.: 12/226,348

(22) PCT Filed: Mar. 10, 2007

(86) PCT No.: PCT/JP2007/057901
§ 371 (c)(1), (2), (4) Date: Oct. 16, 2008

(87) PCT Pub. No.: WO2007/123026
PCT Pub. Date: Nov. 1, 2007

(65) Prior Publication Data
US 2009/0134201 A1    May 28, 2009

(30) Foreign Application Priority Data
Apr. 20, 2006 (JP) ................................. 2006-116549

(51) Int. Cl.
B23K 1/00 (2006.01)
B23K 37/00 (2006.01)
(52) U.S. Cl. ..................... 228/42; 228/44.7; 228/904
(58) Field of Classification Search .................. 228/4.5, 228/180.5, 904, 212, 213, 44.3, 44.7; 269/903, 269/21; 29/281.1; 451/365
See application file for complete search history.

(56) References Cited

U.S. PATENT DOCUMENTS

| | | | | |
|---|---|---|---|---|
| 4,583,676 A | * | 4/1986 | Pena et al. | 228/180.5 |
| 5,162,068 A | * | 11/1992 | Yamamoto et al. | 156/285 |
| 5,320,273 A | * | 6/1994 | Goenka et al. | 228/33 |
| 5,433,371 A | * | 7/1995 | Morisako | 228/180.5 |

(Continued)

FOREIGN PATENT DOCUMENTS
JP    5-109793    4/1993
(Continued)

OTHER PUBLICATIONS
International Search Report issued Jul. 17, 2007 in International Application PCT/JP2007/057901.

Primary Examiner — Kiley Stoner
Assistant Examiner — Carlos Gamino
(74) Attorney, Agent, or Firm — Wenderoth, Lind & Ponack, L.L.P.

(57) ABSTRACT

A work clamp and a wire bonding apparatus that can sufficiently restrain oxidation of a bonding area even while reducing an amount of antioxidant gas that is used are provided. The work clamp includes an interior hollow portion 10 providing an atmosphere of the antioxidant gas, a lower opening portion 11a provided below the interior hollow portion, for containing the bonding area in the interior hollow portion, an upper opening portion 11 provided above the interior hollow portion, for exposing the bonding area, a cavity 13 covering the interior hollow portion and having an area larger than an opening area of the upper opening portion, gas introduction ports 14a, 14b provided at the cavity, for introducing the antioxidant gas into the cavity, and holes 21 connected to below the cavity, for blowing the antioxidant gas introduced from the gas introduction port to a portion other than the bonding area of the work.

5 Claims, 5 Drawing Sheets

U.S. PATENT DOCUMENTS

| | | | |
|---|---|---|---|
| 5,538,176 A * | 7/1996 | Hasegawa et al. | 228/180.5 |
| 5,560,531 A * | 10/1996 | Ruszowski | 228/19 |
| 5,785,237 A * | 7/1998 | Lasto et al. | 228/180.22 |
| 5,862,588 A * | 1/1999 | Heim et al. | 29/840 |
| 6,102,273 A * | 8/2000 | Satoh | 228/42 |
| 6,105,847 A * | 8/2000 | Kim | 228/6.2 |
| 6,234,376 B1 * | 5/2001 | Wicen | 228/180.5 |
| 6,257,478 B1 * | 7/2001 | Straub | 228/6.2 |
| 6,499,644 B2 * | 12/2002 | Cox et al. | 228/19 |
| 6,824,037 B2 * | 11/2004 | Sakai et al. | 228/4.5 |
| 6,866,182 B2 * | 3/2005 | Wong et al. | 228/219 |
| 7,026,190 B2 * | 4/2006 | Kobayashi et al. | 438/114 |
| 7,093,744 B2 * | 8/2006 | Seki et al. | 228/103 |
| 7,182,793 B2 * | 2/2007 | Duan et al. | 29/25.01 |
| 2003/0019906 A1 | 1/2003 | Sakai et al. | |
| 2005/0161488 A1 | 7/2005 | Duan et al. | |
| 2007/0251980 A1 * | 11/2007 | Gillotti et al. | 228/4.5 |
| 2007/0284421 A1 * | 12/2007 | Gillotti et al. | 228/212 |

FOREIGN PATENT DOCUMENTS

JP    2003-37131    2/2003

* cited by examiner

WORK CLAMP AND WIRE BONDING APPARATUS

TECHNICAL FIELD

The present invention relates to a work clamp and a wire bonding apparatus using the same and particularly to a work clamp and a wire bonding apparatus that can sufficiently restrain oxidation of a bonding area even while reducing an amount of antioxidant gas that is used.

BACKGROUND ART

FIG. 5 is a sectional view illustrating a work clamp of a conventional wire bonding apparatus. This work clamp has a mechanism of preventing oxidation of copper if an object of bonding is a bare copper lead frame or if a bonding wire is copper. This mechanism introduces an inert gas such as nitrogen gas into an opening 17 leading to a bonding area.

A semiconductor device in a form of a lead frame 12 holding a die 18 is arranged on a platform or an upper plate 29 of a wire bonding apparatus. The upper plate 29 has a heating mechanism for raising a temperature of the lead frame 12. A wind clamp 16 fixes the lead frame 12 onto the upper plate 29. The opening 17 of the wind clamp 16 is arranged on the lead frame 12 so as to provide an access to the bonding area by a wire bonding work. That is, the bonding area including the die 18 and a part of the lead frame 12 is exposed by the opening 17.

The wind clamp 16 has a cavity 22 connected to the opening 17. A cover 20 is arranged on an upper face of the wind clamp 16 and covers the cavity 22 so as to limit exposure of the cavity to the air containing oxygen. Further, the wind clamp 16 has a conduit 24 therein for switching a direction of nitrogen gas toward the cavity 22. The conduit 24 is arranged so that the nitrogen gas passes through the cavity 22 and then, is fed to the opening 17. The nitrogen gas is introduced from a gas inlet 26 of the wind clamp 16. The gas inlet 26, the cavity 22, and the opening 17 communicate with each other. In this structure, in order to reduce a pressure of the nitrogen gas introduced from the cavity 22 into the opening 17 as compared with a pressure of the nitrogen gas introduced from the conduit 24 into the cavity 22, the cavity 22 has a sectional area larger than that of the conduit 24.

On a bottom face of the wind clamp 16 between the wind clamp 16 and the upper plate 29 or the platform, a hollow space 28 is also provided. The space 28 plays a role of receiving the nitrogen gas from the gas inlet 26 and having the nitrogen gas passed toward the cavity 22 through the conduit 24. Moreover, the space 28 distributes the nitrogen gas to the lead frame 12 in order to protect the lead frame 12 from oxidation. At an end portion of the space 28 far from the bonding area 17, the air directly communicates with the space 28 (See Patent Document 1, for example).

Patent Document 1: US2005/0161488 (FIG. 4)

DISCLOSURE OF THE INVENTION

As mentioned above, a flow of the nitrogen gas in the conventional work clamp is as follows. The nitrogen gas introduced from the gas inlet 26 is once emitted into the hollow space 28, goes into the cavity 22 from the hollow space 28 through the conduit 24, decelerates its flow velocity in the cavity 22 and flows into the opening 17, which is the bonding area. Mixing-in of the outside air into the bonding area is prevented by having the nitrogen gas flow from the gas inlet 26 as above. By this arrangement, the hollow space 28 tries to prevent oxidation of the lead frame 12, while the opening 17 tries to prevent oxidation of the bonding area.

However, with the above conventional work clamp, the nitrogen gas introduced from the gas inlet 26 is once emitted into the hollow space 28 and introduced into the cavity 22 from the hollow space 28 through the conduit 24, and thus, an amount of nitrogen gas sufficient to prevent oxidation of the bonding area can not be introduced into the cavity 22. That is, since the end portion of the hollow space 28 communicates with the air, most of the nitrogen gas flowing into the hollow space 28 is emitted from the end portion to the air, and the amount of nitrogen gas introduced into the cavity 22 through the conduit 24 becomes insufficient. As a result, the oxidation of the bonding area can not be sufficiently restrained.

Further, in the hollow space 28, since the nitrogen gas once blown toward the lead frame 12 is made to flow through the conduit 24, the cavity 22, and the opening 17 to be used for oxidation prevention of the bonding area, an amount of the nitrogen gas that is used is increased, which raises a bonding cost. Further, with the conventional work clamp, even if the amount of the nitrogen gas that is used is increased, the oxidation of the bonding area can not be sufficiently restrained.

The present invention was made in view of the above circumstances and has an object to provide a work clamp and a wire bonding apparatus that can sufficiently restrain oxidation of the bonding area even while reducing an amount of antioxidant gas that is used.

In order to solve the above problem, a work clamp according to the present invention is the one used in a wire bonding apparatus comprising:

an interior hollow portion providing an atmosphere of antioxidant gas in bonding to a bonding area of a work;

a lower opening portion provided below the interior hollow portion, for containing the bonding area in the interior hollow portion;

an upper opening portion provided above the interior hollow portion, for exposing the bonding area;

a cavity covering the interior hollow portion and having an area larger than an opening area of the upper opening portion;

a gas introduction port provided at the cavity, for introducing the antioxidant gas into the cavity; and a hole connected to below the cavity, for blowing the antioxidant gas introduced from the gas introduction port to a portion other than the bonding area of the work.

According to the above work clamp, in wire bonding, the antioxidant gas is made to flow from the gas introduction port of the work clamp through the cavity and the interior hollow portion to the upper opening portion so as to provide an atmosphere of the antioxidant gas in the bonding area. By this arrangement, even if the amount of the antioxidant gas that is used is reduced, the oxidation of the bonding area can be sufficiently restrained.

In addition, in the work clamp according to the present invention, in bonding to the bonding area of the work, the antioxidant gas is preferably introduced from the gas introduction port into the cavity and made to flow from the cavity to the interior hollow portion and also blown to a portion other than the bonding area through the hole from the cavity and emitted to the outside from the interior hollow portion through the upper opening portion.

Further, in the work clamp according to the present invention, the hole is preferably arranged in the periphery of the interior hollow portion.

Further, in the work clamp according to the present invention, the gas introduction port is preferably located on a side farthest from the upper opening portion.

The wire bonding apparatus according to the present invention is an apparatus for wire bonding to a bonding area of a work, comprising:

a stage on which the work is mounted;
a work clamp for fixing the work onto the stage; and
a bonding tool for carrying out bonding to the work, wherein
the work clamp includes:
an interior hollow portion in which the bonding area of the work is arranged;
an upper opening portion provided above the interior hollow portion, for exposing the bonding area;
a cavity covering the interior hollow portion and having an area larger than an opening area of the upper opening portion;
a gas introduction port provided at the cavity, for introducing antioxidant gas into the cavity; and
a hole connected to the cavity and located above a portion other than the bonding area in the work mounted on the stage.

Further, in the wire bonding apparatus according to the present invention, the bonding can be carried out while a space is provided between the hole and a portion other than the bonding area, the antioxidant gas is introduced from the gas introduction port into the cavity and made to flow from the cavity into the interior hollow portion and also to flow from the cavity into the space through the hole and emitted from the interior hollow portion to the outside through the upper opening portion.

As mentioned above, according to the present invention, a work clamp and a wire bonding apparatus that can sufficiently restrain oxidation of the bonding area even while reducing an amount of antioxidant gas that is used can be provided.

Figure 1:
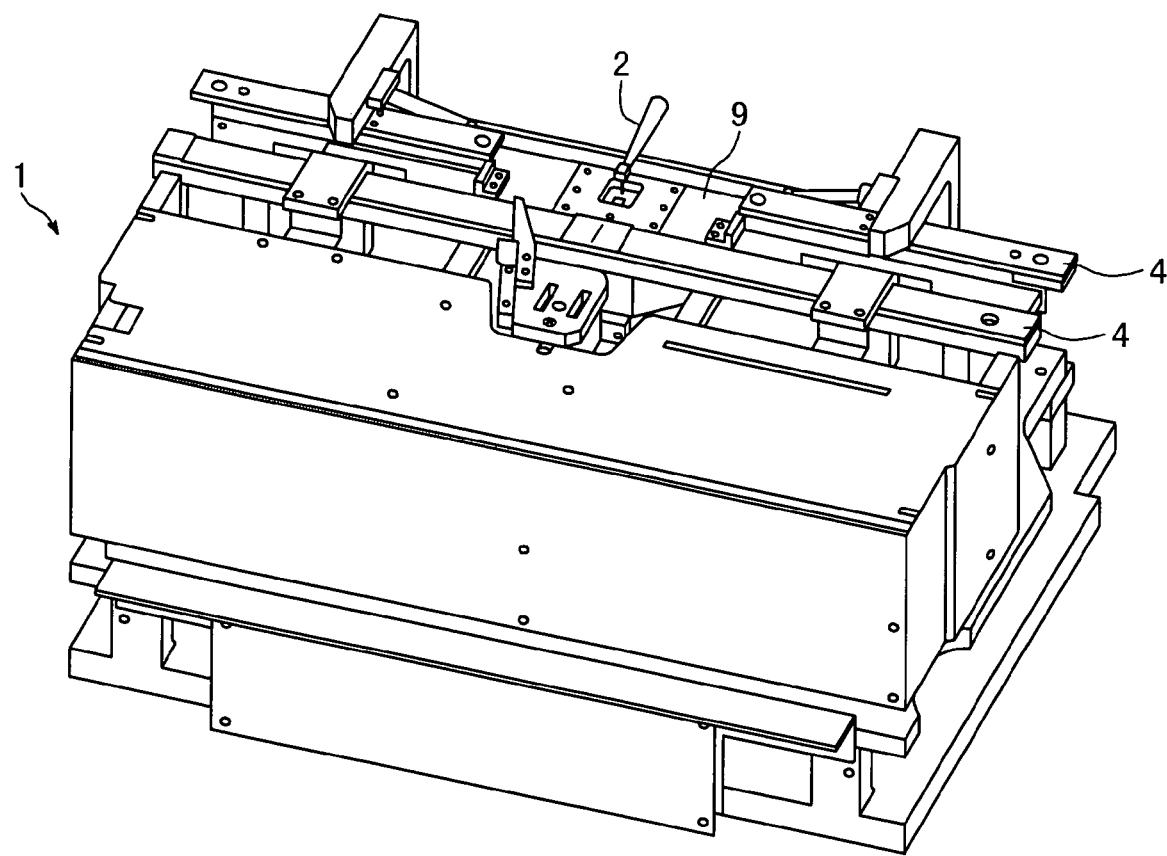
FIG. 1 is a perspective view illustrating a wire bonding apparatus according to an embodiment of the present invention.

EXPLANATION OF REFERENCE NUMERALS 1 wire bonding apparatus
2 bonding head
4 rail
5 bonding chip
6 lead frame
7 heater
8 bonding tool (capillary)
9 work clamp
10 interior hollow portion
11 upper opening portion
11a lower opening portion
12 lead frame
13 cavity
14a to 14d gas introduction port
15a to 15d gas path
16 wind clamp
17 opening
18 die
19a to 19d gas inlet
20 cover
21 hole
22 cavity
23 lid portion
24 conduit
25 space
26 gas inlet
27 bonding stage
28 hollow space
29 upper plate

BEST MODE FOR CARRYING OUT THE INVENTION

An embodiment of the present invention will be described below referring to the attached drawings.

Figure 2:
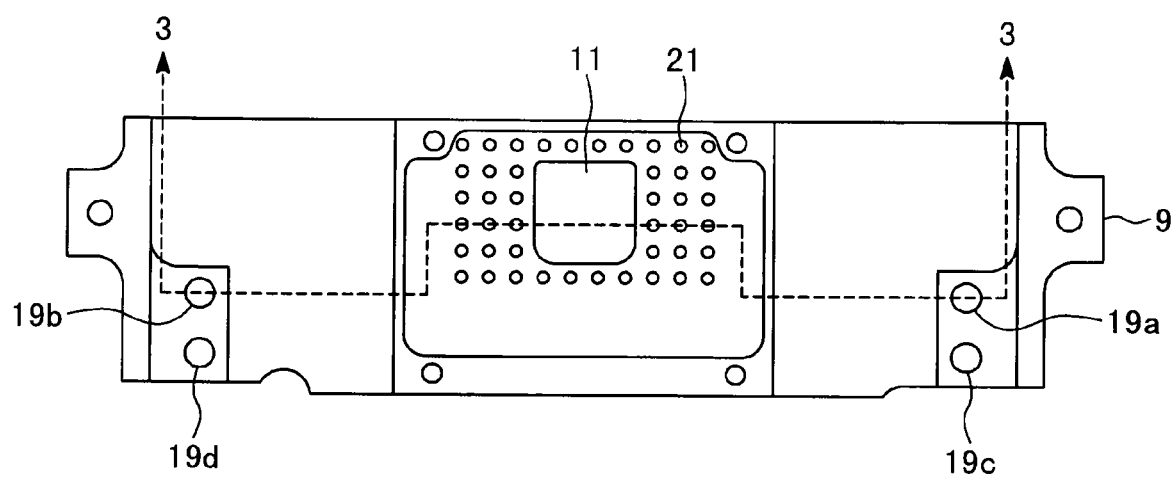
FIG. 2 is a top view of a work clamp shown in FIG. 1.
Figure 3:
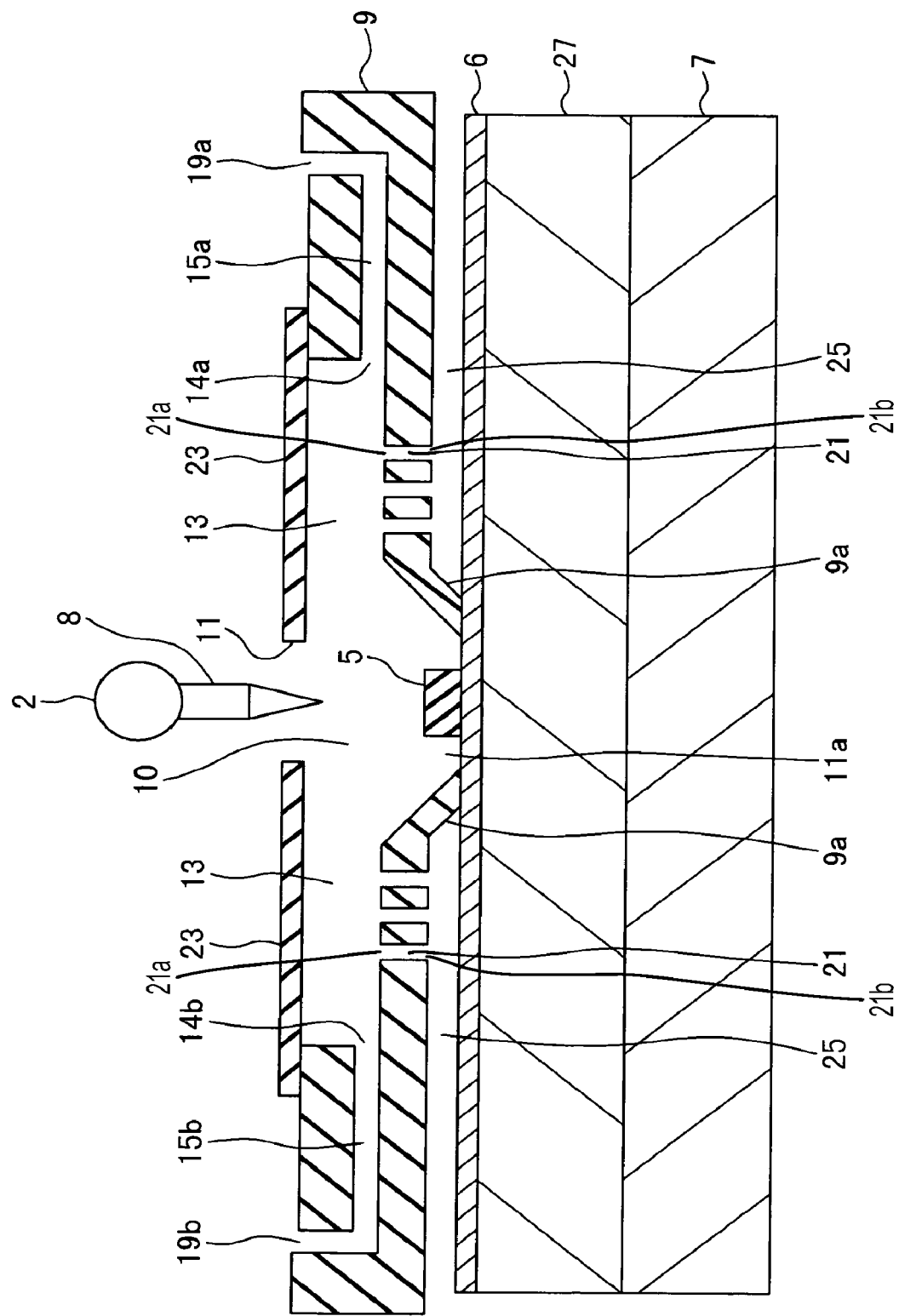
FIG. 3 is a sectional view illustrating a state where the work is held by the work clamp on a stage for carrying out bonding.
Figure 4:
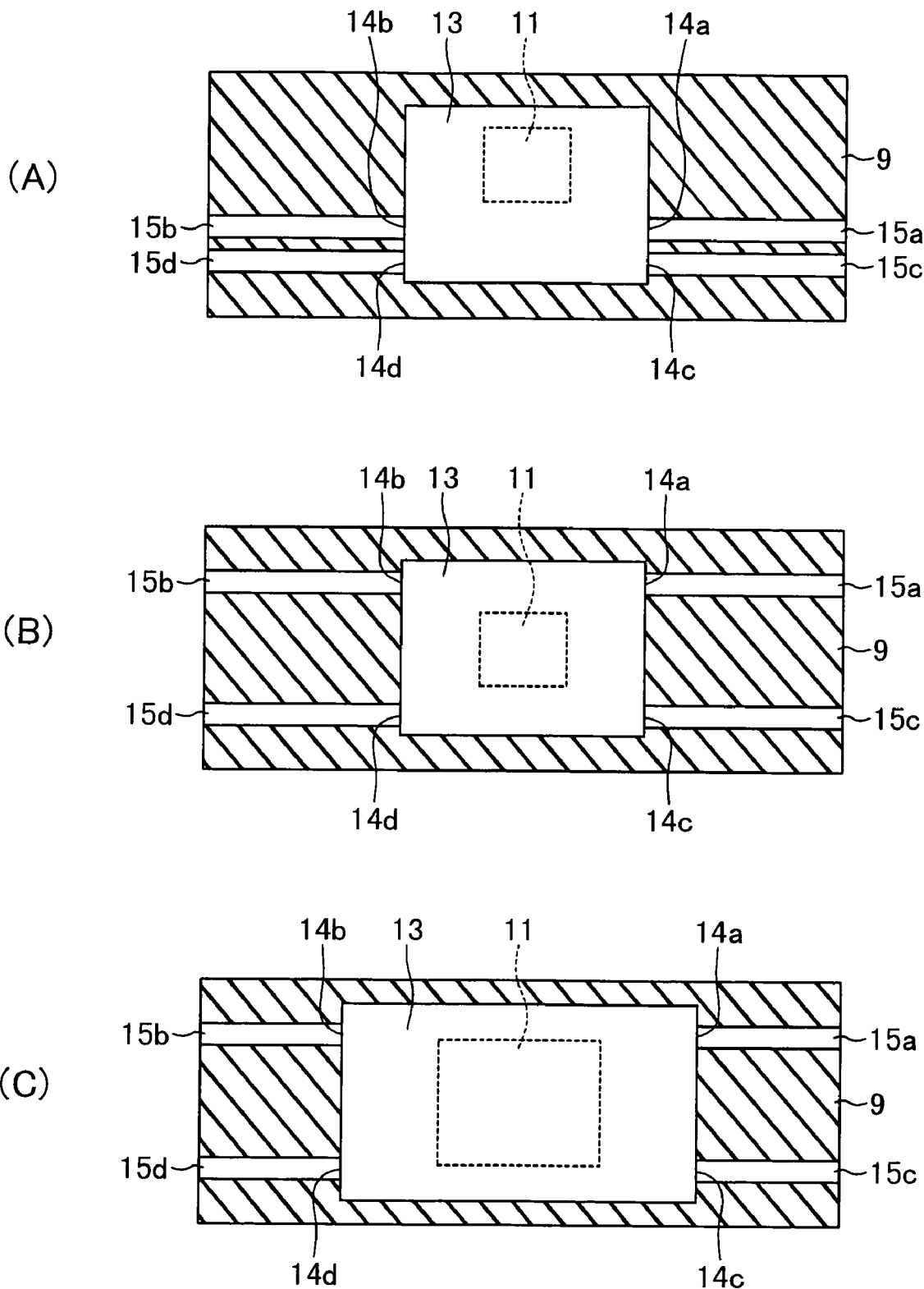
FIG. 4A is a sectional view obtained by cutting the work clamp shown in FIG. 2 on a face along a gas path.
FIG. 4B is a sectional view illustrating a variation 1 of the work clamp according to the embodiment.
FIG. 4C is a sectional view illustrating a variation 2 of the work clamp according to the embodiment.
Figure 5:
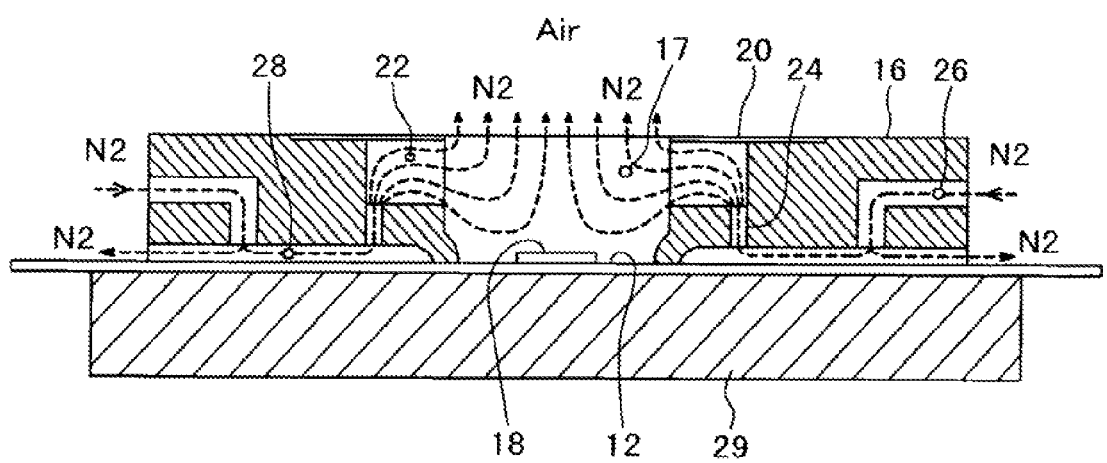
FIG. 5 is a sectional view illustrating a work clamp of a conventional wire bonding apparatus.

FIG. 1 is a perspective view illustrating a wire bonding apparatus according to the embodiment of the present invention. FIG. 2 is a top view of a work clamp shown in FIG. 1. FIG. 3 is a sectional view illustrating a state where a work is held on a stage by the work clamp shown in FIG. 2 for carrying out bonding and shows a portion corresponding to a section of the work clamp along an arrow 3-3 in FIG. 2. FIG. 4A is a sectional view obtained by cutting the work clamp shown in FIG. 2 on a face along a gas path.

As shown in FIG. 1, a wire bonding apparatus 1 has a bonding head 2, a work clamp 9, and a rail 4. Below the work clamp 9, a bonding stage is arranged. A lead frame 6 shown in FIG. 3 on which a bonding chip 5 is mounted is a work to be bonded. Such works continued in plural are moved on the rail 4, a bonding area of the work (that is, a lead portion at the bonding chip and its periphery) is located below the bonding head 2, and wire bonding is carried out in the bonding area by a bonding tool (capillary) 8 of the bonding head 2. Such an operation is repeated that after bonding has been carried out to a single bonding area, the work is moved on the rail 4, the bonding area of the adjacent work is positioned below the bonding head 2 and the wire bonding is carried out.

As shown in FIG. 3, a heater 7 is provided below the bonding stage 27. The heater 7 heats the work approximately at 30 to 500° C. when the work is mounted on the bonding stage 27 for bonding. Since the bonding is carried out while heating the work as above, oxidation of copper becomes a problem if the work or bonding wire is made of copper. Then, a mechanism for restraining oxidation is provided at the work clamp 9 shown in FIG. 2 for holding the work on the bonding stage 27.

As shown in FIG. 3, in wire bonding, the lead frame 6, which is a work to be bonded, is held on the heater 7 of the bonding stage by the work clamp 9. That is, the lead frame 6 is mounted on the bonding stage 27, and the lead frame 6 is pressed and held by the work clamp 9 on the bonding stage 27.

As shown in FIGS. 2 and 3, the work clamp 9 has an interior hollow portion 10 providing an atmosphere of antioxidant gas to the bonding chip, which is the bonding area of the work, and the lead frame 6 in its periphery when bonding is carried out. Below the interior hollow portion 10, a lower opening portion 11a for containing the bonding chip 5 in the interior hollow portion 10 is provided. The lower opening portion 11a is formed by a tip end of a pressing portion 9a for pressing the lead frame 6. The tip end of the pressing portion 9a presses the bonding area of the lead frame 6 while surrounding it. The interior hollow portion 10 side and the outside of the pressing portion 9a have inclined faces, respectively, and when the lead frame 6 is pressed by the pressing portion 9a, a space 25 is formed between the lead frame 6 and the work clamp 9.

Above the interior hollow portion 10, an upper opening portion 11 for exposing the bonding chip 5, which is the bonding area, and the lead frame 6 in its periphery is provided. The upper opening portion 11 moves the capillary 8 above the bonding chip 5 and the lead frame 6 during bonding. The upper opening portion 11 is provided at a lid portion 23.

Further, the work clamp 9 has a cavity 13, and the cavity 13 covers the periphery of the interior hollow portion 10 and has an area larger than an opening area of the upper opening portion 11. That is, the cavity 13 and the interior hollow portion 10 are continued in terms of space, and a flat-face shaped area of the cavity is larger than the opening area of the upper opening portion. The cavity 13 is located below the lid portion 23.

At the cavity 13, gas introduction ports 14a to 14d (See FIGS. 2, 3, and 4A) are provided, and the gas introduction ports 14a to 14d introduce an inert gas or reductive gas ($N_2$ gas, $N_2$ mixed gas, Ar gas, for example), which is antioxidant gas, into the cavity 13. Each of the gas introduction ports 14a to 14d is connected to gas inlets 19a, 19b by pipe-like gas paths 15a to 15d. That is, at one end of each of the gas paths 15a, 15b, the gas inlets 19a, 19b are provided, while at the other end of each of the gas paths 15a, 15b, the gas introduction ports 14a, 14b are provided. Further, the gas introduction ports 14a to 14d are arranged on the side substantially the farthest (as far as possible) from the upper opening portion as shown in FIG. 4A. In this embodiment, since the upper opening portion 11 is not located at the center of the work clamp 9, the gas introduction ports are arranged while being biased to one side of the cavity.

In addition, the work clamp 9 has a plurality of holes (or conduits) 21. Each of the plurality of holes having a first end 21a and a second end 21b. The plurality of holes 21 is connected to below the cavity 13, for blowing the antioxidant gas introduced from the gas introduction ports 14a to 14d to a portion other than the bonding area of the work (that is, the lead frame 6 in the periphery of the bonding area). The holes 21 are arranged in the periphery of the interior hollow portion 10 as shown in FIG. 2.

Next, a mechanism for restraining oxidation of the work clamp 9 will be described.

When bonding is to be carried out while heating the work by the heater 7, in order to prevent oxidation of the bonding wire, the bonding chip 5, and the lead frame 6, the antioxidant gas is introduced into the interior hollow portion 10 so as to provide an atmosphere of the antioxidant gas. In detail, first, the antioxidant gas is introduced into the gas paths 15a to 15d through the gas inlets 19a to 19d, the antioxidant gas is introduced from the gas introduction ports 14a to 14d into the cavity 13, the antioxidant gas is made to flow through the interior hollow portion 10 from the cavity 13 and also introduced into the space 25 from the cavity 13 through the plurality of holes 21 and blown to the lead frame 6, the antioxidant gas is emitted from the interior hollow portion 10 to the outside of the work clamp through the upper opening portion 11, and the antioxidant gas is emitted to the outside from the end portion on the side far from the bonding area in the space 25.

According to the above embodiment, by having the antioxidant gas flow to the work clamp 9 and supplying the antioxidant gas into the interior hollow portion 10, oxidation of the copper bonding wire and the bare copper lead frame in the bonding area can be prevented.

In detail, mixing of the outside air (air) into the work clamp 9 is restrained by flowing the antioxidant gas from the gas inlets 19a to 19d, oxidation of the lead frame is restrained by blowing the antioxidant gas from the plurality of holes 21 to the lead frame 6, and oxidation of the bonding area can be restrained by introducing the antioxidant gas into the cavity 13 and the interior hollow portion 10. The antioxidant gas enters the cavity 13 from the gas inlets 19a to 19d through the gas paths 15a to 15d and then the gas introduction ports 14a to 14d. Then, the antioxidant gas filled in the cavity 13 is emitted to the outside of the work clamp through the bonding area of the interior hollow portion 10 and the holes 21. The holes 21 are present in plural, and by changing the number or size of the holes 21 according to the work to be bonded, oxidation of the lead frame can be effectively restrained.

Further, by providing the cavity 13, a flow velocity of the gas emitted from the upper opening portion 11 above the bonding area can be made slow. Further, by providing a plurality of (four in this embodiment) gas introduction ports, the convection velocity of the antioxidant gas at the upper opening portion 11 can be made slow. As a result, since inclusion of air from the upper opening portion 11 is reduced, the oxidation of the bonding area can be restrained and the upper opening portion 11 can be enlarged. That is, since the upper opening portion 11 exposes the bonding area, an opening portion in accordance with the size of the bonding area needs to be provided. Therefore, the size of the upper opening portion 11 can not be made smaller than the bonding area. With such upper opening portion, the air from the upper opening portion can be easily included into the bonding area of the interior hollow portion 10, and the inclusion of the air from the upper opening portion can not be reduced with the prior art. But in this embodiment, the inclusion of the air from the upper opening portion can be reduced. Thus, the oxidation of the bonding area can be sufficiently restrained.

In addition, the reason why the gas introduction ports are provided in plural is that if there is only one gas introduction port, the flow velocity of the antioxidant gas flowing through the gas introduction port needs to be raised in order to sufficiently ensure the flow rate of the antioxidant gas supplied to the cavity, and if the flow velocity is high, the air can be easily included from the upper opening portion, by which the oxidation of the bonding area can not be sufficiently restrained.

Further, in this embodiment, since the oxidation of the bare copper lead frame can be prevented, there is no need to apply plating processing on the surface of the lead, which can reduce time and cost for the plating process.

Further, by having the antioxidant gas flow into the work clamp, heat in the space above the bonding area in the interior hollow portion 10 can be made to escape efficiently. Thus, an influence of heat and wind when a ball is formed at the tip end of the bonding wire can be reduced, and stable wire bonding can be carried out. Further, since rise of a peripheral temperature of the bonding area can be restrained, expansion of a horn, camera and the like of the wire bonding apparatus can be restrained, and as a result, positional accuracy of the bonding can be improved.

Note that the present invention is not limited to the above embodiment but is capable of various changes within a scope not departing from the gist of the present invention. For example, in this embodiment, the lead frame 6 on which the bonding chip 5 is mounted is a work to be bonded, but not limited to that, a tape-like object can be also used as the work.

FIG. 4B shows a variation 1 of the work clamp according to the embodiment and is a sectional view cut at the same portion as that in FIG. 4A. In FIG. 4B, the same reference numerals are given to the same portions in FIG. 4A and only different portions will be described.

As shown in FIG. 4B, the upper opening portion 11 is arranged at the center of the work clamp 9. Accordingly, the gas introduction ports 14a to 14d are arranged at four corners of the cavity 13 which are the positions as far as possible from the upper opening portion 11. By this arrangement, the antioxidant gas can be made to prevail over the entire cavity substantially uniformly.

In the above variation 1, too, the same effect as that in the above embodiment can be obtained.

FIG. 4C shows a variation 2 of the work clamp according to the embodiment and a sectional view cut at the same portion as that in FIG. 4A. In FIG. 4C, the same reference numerals are given to the same portions in FIG. 4A and only different portions will be described.

As shown in FIG. 4C, an opening area of the upper opening portion 11 is formed larger than that in the above embodiment. In addition, the upper opening portion 11 is arranged at the center of the work clamp 9. Accordingly, an area of the cavity 13 is made larger than that in the above embodiment, by which the flow velocity of the antioxidant gas in the bonding area is made small, and the cavity gas introduction ports 14a to 14d are arranged at four corners of the cavity 13 which are the positions as far as possible from the upper opening portion 11.

In the variation 2, too, the same effect as that in the above embodiment can be obtained.

The invention claimed is:

1. A wire bonding apparatus comprising:
   a stage;
   a work clamp; and
   a bonding tool, wherein
   said work clamp includes:
   an interior hollow portion;
   a lower opening portion provided below said interior hollow portion, for containing a bonding area of a work in said interior hollow portion;
   an upper opening portion provided above said interior hollow portion;
   a cavity covering and directly contacting said interior hollow portion, and having an area larger than an opening area of said upper opening portion;
   a gas introduction port provided at said cavity; and
   a plurality of holes disposed in said work clamp, each hole of the plurality of holes having a first end and a second end, for each hole, said first end being below and directly connected to said cavity, and said second end being directly connected to a space above the work mounted on said stage outside of said hollow interior portion, said plurality of holes for blowing antioxidant gas introduced from said gas introduction port to the work located outside of said interior hollow portion.

2. The wire bonding apparatus according to claim 1, wherein the bonding is carried out while a space is provided below said holes, said antioxidant gas is introduced from said gas introduction port into said cavity and made to flow from said cavity into said interior hollow portion and also to flow from said cavity into said space through said holes and emitted from said interior hollow portion to the outside through said upper opening portion.

3. The wire bonding apparatus according to claim 1, wherein said cavity covers a whole side face of said interior hollow portion located between said upper opening portion and said lower opening portion.

4. The wire bonding apparatus according to claim 1, wherein each said hole of said plurality of holes is arranged and configured so as to be capable of blowing the antioxidant gas out of said cavity from said first end through said second end.

5. The wire bonding apparatus according to claim 1, wherein each said hole of said plurality of holes is arranged so as to extend in a longitudinal direction that is transverse to a surface of the bonding area of the work.

* * * * *